United States Patent [19]

Malladi et al.

[11] Patent Number: 5,701,085

[45] Date of Patent: Dec. 23, 1997

[54] APPARATUS FOR TESTING FLIP CHIP OR WIRE BOND INTEGRATED CIRCUITS

[75] Inventors: Deviprasad Malladi, Campbell; Lee Frederick Hanson, Cupertino; Jean Kahahane, Redwood City, all of Calif.

[73] Assignee: Sun Microsystems, Inc., Mountain View, Calif.

[21] Appl. No.: 498,791

[22] Filed: Jul. 5, 1995

[51] Int. Cl.⁶ ............................................. G01R 1/07
[52] U.S. Cl. ............................... 324/754; 324/755
[58] Field of Search ........................ 324/158.1, 73.1, 324/754, 765, 755, 762; 439/482, 70, 62–68; 437/8; 257/40, 48

[56] References Cited

U.S. PATENT DOCUMENTS

| | | | |
|---|---|---|---|
| 5,006,792 | 4/1991 | Malhi et al. | 324/762 |
| 5,123,850 | 6/1992 | Elder et al. | 324/158.1 |
| 5,302,891 | 4/1994 | Wood et al. | 324/765 |
| 5,397,997 | 3/1995 | Tuckerman et al. | 324/758 |
| 5,435,733 | 7/1995 | Chernicky et al. | 324/762 |
| 5,440,240 | 8/1995 | Wood et al. | 324/765 |
| 5,548,884 | 8/1996 | Kim | 324/765 |

*Primary Examiner*—Vinh P. Nguyen
*Attorney, Agent, or Firm*—Flehr Hohbach Test Albritton & Herbert LLP; William S. Galliani

[57] ABSTRACT

An apparatus for use in testing wire bond or flip chip connected integrated circuits includes a housing with a top side, a bottom side, and a perimeter region defining a housing central aperture. The housing further includes flip chip pads to accommodate flip chip solder connections to a flip chip integrated circuit during a first test period and wire bond pads to accommodate wire bond connections to a wire bond integrated circuit during a second test period. There are connector pins on the bottom side of the housing for connection with a printed circuit board. The printed circuit board includes an access aperture which is aligned with the housing central aperture. This configuration allows a test probe to access a flip chip integrated circuit positioned within the housing. It also allows a heat sink to be used when the housing incorporates a wire bonded integrated circuit.

17 Claims, 3 Drawing Sheets

APPARATUS FOR TESTING FLIP CHIP OR WIRE BOND INTEGRATED CIRCUITS

BRIEF DESCRIPTION OF THE INVENTION

This invention relates generally to the testing of integrated circuits. More particularly, this invention relates to an integrated circuit testing apparatus that can be used with integrated circuits configured for wire bond connections or flip chip connections.

BACKGROUND OF THE INVENTION

Two prominent techniques for electrically coupling an integrated circuit to an integrated circuit package are wire bond connections and flip chip connections. Wire bond connections are the most prevalent technique used in the microelectronics industry. The wire bonding process starts by mounting an integrated circuit with its inactive backside down. Wires are then bonded between the active front side of the integrated circuit and the integrated circuit package. Wire bonding may be accomplished through ultrasonic bonding, thermocompression bonding, or thermo-sonic bonding.

Flip chip techniques to electrically couple an integrated circuit to an integrated circuit package are also well known. Sometimes referred to as a controlled collapse chip connection, the term flip chip refers to the fact that it is opposite to the traditional approach of placing the inactive backside of an integrated circuit on a substrate. That is, with a flip chip connection the active front side of an integrated circuit is placed on a substrate. An integrated circuit configured for a flip chip connection has solder bumps on wettable metal terminals. The substrate, in turn, has a matching footprint of solder wettable terminals. The solder bumps are aligned and all joints are simultaneously formed by reflowing the solder.

As can be appreciated from the foregoing discussion, a wire bond configuration is quite distinct from a flip chip configuration. Accordingly, in the prior art, separate packages are used for each configuration. It would be cost effective and therefore desirable to provide a single apparatus to house either a wire bond or flip chip connected integrated circuit. Such an apparatus would be particularly useful as a fixture for testing integrated circuits.

Integrated circuits undergo extensive testing in a test fixture prior to permanent packaging. Typically, a first test fixture is configured for wire bond connections and a second test fixture is configured for flip chip connections. The separate fixtures are a result of the different configurations of the two technologies, as discussed above. The separate fixtures are also required in view of incompatible chip cooling and chip testing requirements for the two technologies. The distinct flip chip and wire bond configurations preclude a single heat sink device from working with both technologies. In addition, in the case of a flip chip, the entire surface of the chip must be accessed for testing, while for a wire bond chip only the perimeter of the chip, with its perimeter bond pads, must be accessible.

It would be cost effective and therefore desirable to provide a single test fixture that can accommodate both wire bond and flip chip connected integrated circuits. Such a fixture must overcome the distinct configurations of the two technologies and the incompatible chip cooling and chip testing requirements of the two technologies.

SUMMARY OF THE INVENTION

The invention is an apparatus for use in testing wire bond or flip chip connected integrated circuits. The apparatus includes a housing with a top side, a bottom side, and a perimeter region defining a housing central aperture. The housing further includes flip chip pads to accommodate flip chip solder connections to a flip chip integrated circuit during a first test period and wire bond pads to accommodate wire bond connections to a wire bond integrated circuit during a second test period. There are connector pins on the bottom side of the housing for connection with a printed circuit board. The printed circuit board includes an access aperture which is aligned with the housing central aperture. This configuration allows a test probe to access the flip chip integrated circuit positioned within the housing. It also allows a heat sink to be used when the housing incorporates the wire bonded integrated circuit.

The invention advantageously provides a single test fixture that can accommodate the large structural distinctions between a flip chip integrated circuit and a wire bond integrated circuit. The single fixture configuration results in cost savings. However, the single fixture configuration does not sacrifice functionality. The alignment between the access aperture of the printed circuit board and the housing central aperture allows a heat sink to be used in either the wire bond or flip chip configuration. In addition, the alignment between apertures allows a test probe to access a flip chip integrated circuit positioned within the housing 22.

BRIEF DESCRIPTION OF THE DRAWINGS

For a better understanding of the nature and objects of the invention, reference should be made to the following detailed description taken in conjunction with the accompanying drawings, in which.

Like reference numerals refer to corresponding parts throughout the several views of the drawings.

DETAILED DESCRIPTION OF THE INVENTION

Figure 1:
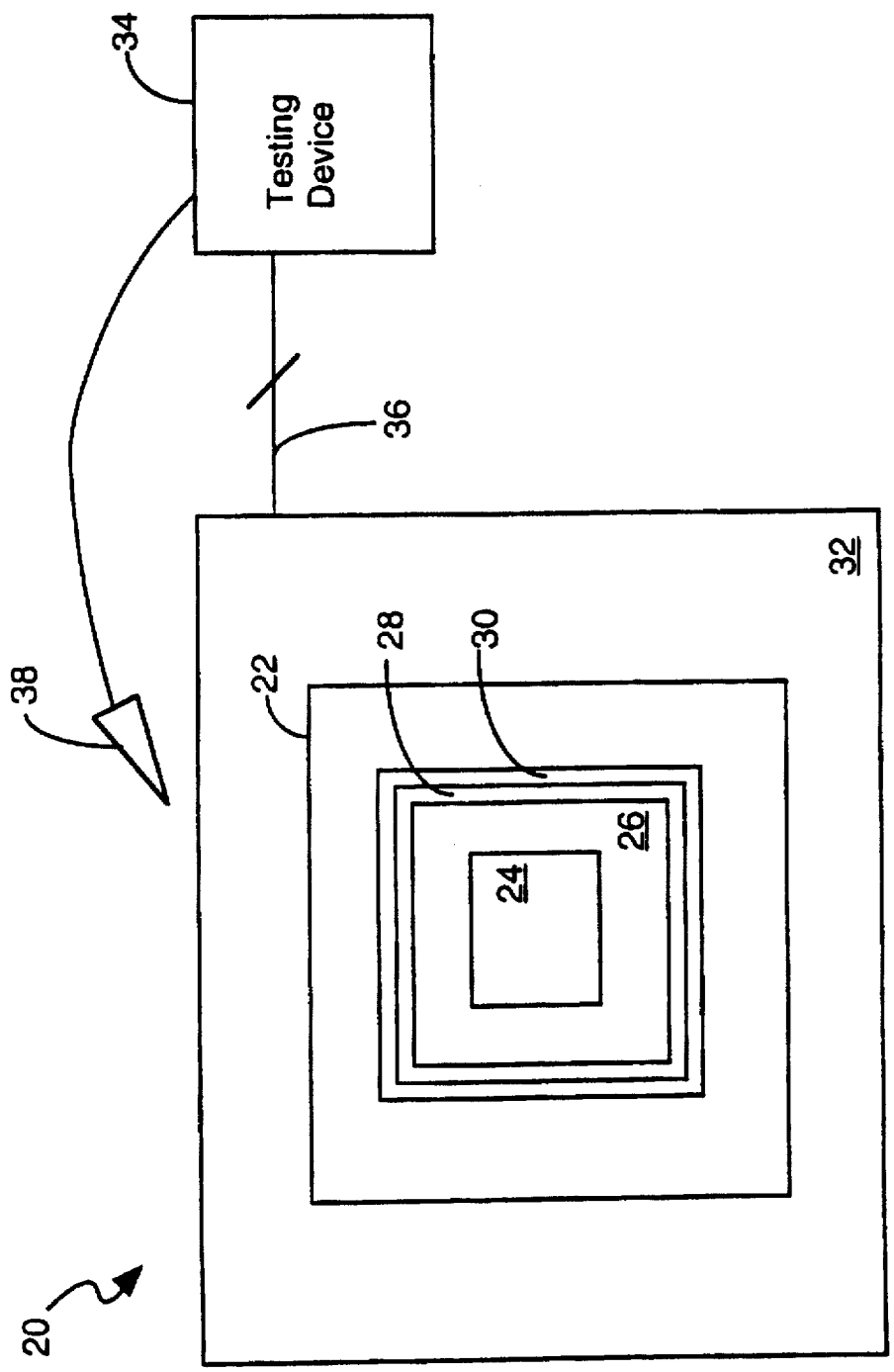
FIG. 1 is a simplified top view of one embodiment of the testing apparatus of the invention.

FIG. 1 is a simplified top view of one embodiment of the testing apparatus 20 of the invention. The apparatus 20 includes an integrated circuit housing 22 which has a perimeter region that defines a housing central aperture 24. Surrounding the housing central aperture 24 is a flip chip pad shelf 26. The flip chip pad shelf 26 is used to make connections to a flip chip integrated circuit (not shown). Surrounding the flip chip pad shelf 26 is a first wire bond pad shelf 28 and a second wire bond pad shelf 30. The wire bond pad shelves 28 and 30 are used to make wire bond connections to a wire bond pads on an integrated circuit (not shown).

The integrated circuit housing 22 is positioned on a printed circuit board 32. The printed circuit board 32 has an access aperture corresponding to the housing central aperture 24, the use of which is described below. A testing device 34 applies, through testing device bus 36, test signals to the printed circuit board 32. The printed circuit board 32 routes the signals to the integrated circuit housing 22, which in turn, applies them to an integrated circuit positioned therein. After processing by the integrated circuit, the processed test signals are returned to the testing device, via the integrated circuit housing 22 and printed circuit board 32.

FIG. 1 also illustrates a test probe 38. A test probe 38 is sometimes used in lieu of a printed circuit board 32 to apply signals to an integrated circuit. That is, a test probe 38 is placed in direct contact with selected locations on an integrated circuit to test the integrated circuit.

Test probes 38, testing devices 34, printed circuit boards 32, and integrated circuit housings 22 are individually known in the art. The present invention is directed toward a novel combination of these elements. More particularly, the invention is directed toward a combination of these elements to allow a single apparatus to be used for both flip chip and wire bond connections. The invention is directed toward a housing 22 with a housing central aperture that may be used for connection to a heat sink or for access by a test probe 38, depending upon the type of integrated circuit that is positioned within the housing 22. The housing central aperture allows the entire surface of a flip chip to be accessed for testing purposes. The housing central aperture provides an additional synergistic benefit of facilitating connection to a heat sink when the apparatus is configured for a wire bond connection.

The central benefit of the apparatus of the invention is that a single housing fixture 22 may be used for both flip chip connections and wire bond connections. A related benefit of the invention is that in either configuration, effective circuit cooling may be accomplished through the use of a heat sink.

Figure 2:
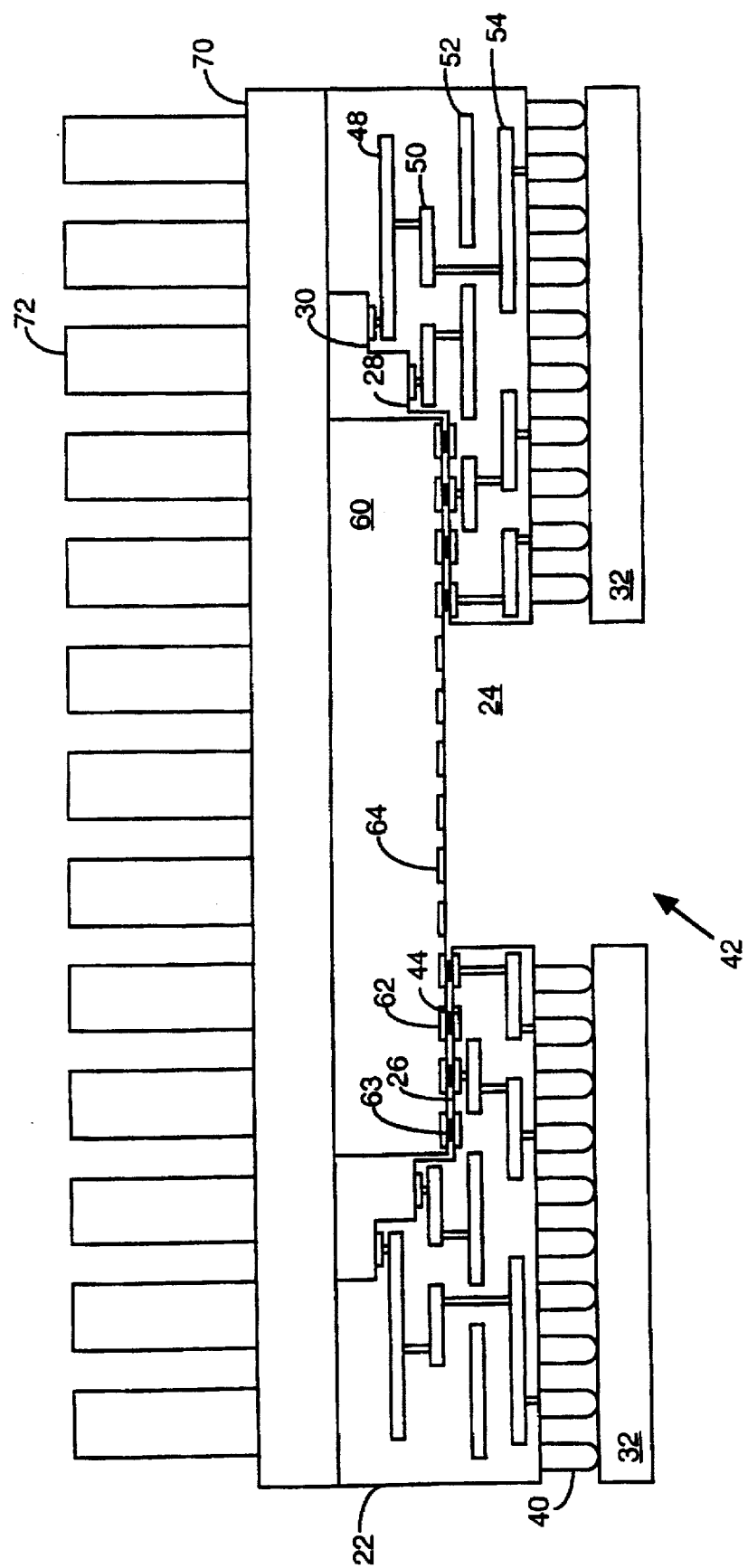
FIG. 2 is a cross-sectional view of the apparatus of the invention accommodating a flip chip connected integrated circuit.
Figure 3:
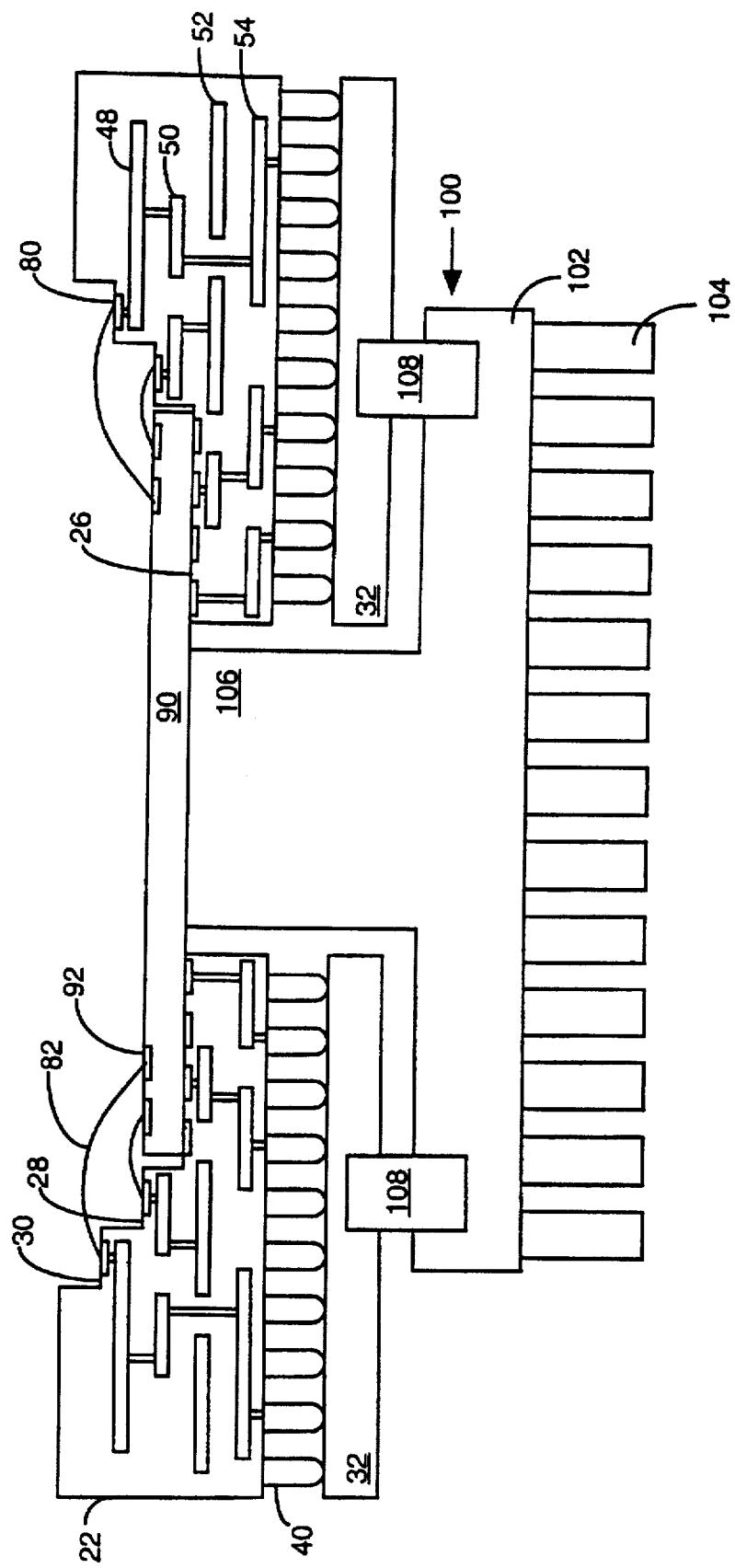
FIG. 3 is a cross-sectional view of the apparatus of the invention accommodating a wire bonded integrated circuit.

The invention and its advantages are more fully appreciated with reference to FIGS. 2 and 3. FIG. 2 is a cross-sectional view of the housing 22. The nature of the housing central aperture 24 is more fully appreciated in this figure, as is the nature of the access aperture 42 formed within the printed circuit board 32.

The housing 22 includes connector pins 40 that are attached to the printed circuit board 32 in a standard manner. It can be seen in FIG. 2 that the flip chip pad shelf 26 supports a set of flip chip pads 44. The flip chip pads 44 are electrically connected to the connectors pins 40 through a multi-planar conductive interconnection structure, which in this embodiment, includes a first metal layer 48, a second metal layer 50, a third metal layer 52, and a fourth metal layer 54. Multi-planar conductive interconnection structures are known in the art.

A flip chip integrated circuit 60 is positioned within the housing 22. The flip chip integrated circuit 60 includes integrated circuit flip chip bond pads 62 which are aligned with the flip chip pads 44 and then connected in a standard manner. The flip chip integrated circuit 60 also includes central integrated circuit flip chip bond pads that may be accessed by the test probe 38, when the test probe is passed through the access aperture 44 and housing central aperture 24.

The top of the housing 22 supports a flat heat sink 70, which may be implemented with heat sink fins 72. The flat heat sink 70 is in physical contact with the integrated circuit 60. Heat transfer between the two devices may be enhanced by using a thermal grease.

Attention now turns to FIG. 3, which is a cross-sectional view of the housing 22 implemented to accommodate a wire bonded integrated circuit 90. It can be seen in FIG. 3 that the first wire bond pad shelf 28 and the second wire bond pad shelf 30 each support bond shelf bond pads 80. Bond wires 82 are connected between the bond shelf bond pads 80 and the integrated circuit bond pads 92.

FIG. 3 illustrates a plateaued heat sink 100, which includes a base region 102 supporting heat sink fins 104 and a plateau region 106. The plateau region 106 is inserted through the access aperture 42 of the printed circuit board 32 and the housing central aperture 24. The plateaued heat sink 100 may be supported by one or more heat sink connectors 108 affixed to the printed circuit board 32. For example, the heat sink connectors 108 may be implemented as clamps.

Advantageously, the components used in connection with the invention may be constructed using well known techniques. In other words, in view of the technical description provided herein, one skilled in the art could use any number of known techniques to form the housing 22, printed circuit board 32, heat sink 100, testing device 34, and test probe 38.

The foregoing descriptions of specific embodiments of the present invention am presented for purposes of illustration and description. They are not intended to be exhaustive or to limit the invention to the precise forms disclosed, obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

We claim:

1. A method of constructing a test apparatus configured to test wire bond or flip chip connected integrated circuits, said method comprising the steps of:

providing a housing including
flip chip pads to accommodate flip chip solder connections to a first integrated circuit, and
wire bond pads to accommodate wire bond connections to a second integrated circuit, wherein said first integrated circuit is positioned in said housing during a first test period and said second integrated circuit is positioned in said housing during a second test period;

providing a housing with a top side, a bottom side, and a perimeter region defining a housing central aperture;

providing connector pins on the bottom side of said housing;

providing a multi-planar conductive interconnection structure electrically connecting said connector pins with said wire bond pads and said flip chip pads; and providing a printed circuit board electrically connected to said connector pins, said printed circuit board including an access aperture which is aligned with said housing central aperture.

2. The method of claim 1 further comprising the step of providing a testing device connected to said printed circuit board, said testing device applying outgoing test signals to said printed circuit board which routes said outgoing test signals to said connector pins of said housing, such that said outgoing test signals are processed by said first integrated circuit during said first test period and said second integrated circuit during said second test period to produce processed test signals that are applied to said connector pins of said housing and are thereby routed by said printed circuit board to said testing device which interprets the performance of said first integrated circuit and said second integrated circuit therefrom.

3. The method of claim 2 further comprising the step of providing a testing device with a test probe that is positioned through said access aperture during said first test period to obtain test probe signals from said first integrated circuit.

4. The method of claim 1 further comprising the step of positioning a flat heat sink on said top side of said housing during said first test period so as to cool said first integrated circuit.

5. The method of claim 1 further comprising the step of positioning a plateaued heat sink through said access aperture during said second test period so as to cool said second integrated circuit.

6. The method of claim 5 further comprising the step of affixing said plateaued heat sink to said printed circuit board.

7. The method of claim 1 further comprising the step of forming said flip chip pads on a flip chip pad shelf surrounding said housing central aperture.

8. The method of claim 7 further comprising the step of forming said wire bond pads on a first wire bond pad shelf surrounding said flip chip pad shelf.

9. The method of claim 8 further comprising the step of forming said wire bond pads on a second wire bond pad shelf surrounding said first wire bond pad shelf.

10. An integrated circuit test apparatus, comprising:
   a housing configured to alternately accept wire bond integrated circuits and flip chip integrated circuits, said housing including
      a top side, a bottom side, and a perimeter region defining a housing central aperture,
      a flip chip pad shelf, surrounding said housing central aperture, supporting flip chip pads to accommodate flip chip solder connections to said flip chip integrated circuit during a first test period, and
      a wire bond pad shelf, surrounding said housing central aperture, supporting wire bond pads to accommodate wire bond connections to said wire bond integrated circuit during a second test period.

11. The apparatus of claim 10 further comprising:
   connector pins on said bottom side; and
   a multi-planar conductive interconnection structure electrically connecting said connector pins with said wire bond pads and said flip chip pads.

12. The apparatus of claim 11 further comprising:
   a printed circuit board electrically connected to said connector pins, said printed circuit board including an access aperture which is aligned with said housing central aperture.

13. The apparatus of claim 12 further comprising a testing device connected to said printed circuit board, said testing device applying outgoing test signals to said printed circuit board which routes said outgoing test signals to said connector pins of said housing, such that said outgoing test signals are processed by said flip chip integrated circuit during said first test period and said wire bond integrated circuit during said second test period to produce processed test signals that are applied to said connector pins of said housing and are thereby routed by said printed circuit board to said testing device which interprets the performance of said flip chip integrated circuit and said wire bond integrated circuit therefrom.

14. The apparatus of claim 13 further comprising a test probe connected to said testing device, said test probe being positionable through said access aperture during said first test period to obtain test probe signals from said flip chip integrated circuit.

15. The apparatus of claim 12 further comprising a flat heat sink positioned on said top side of said housing during said first test period so as to cool said flip chip integrated circuit.

16. The apparatus of claim 12 further comprising a plateaued heat sink positioned through said access aperture during said second test period so as to cool said second integrated circuit.

17. The apparatus of claim 16 wherein said plateaued heat sink is connected to said printed circuit board.

\* \* \* \* \*